United States Patent

Pascucci

[19]

[11] Patent Number: 5,812,467
[45] Date of Patent: Sep. 22, 1998

[54] REDUNDANCY MEMORY REGISTER

[75] Inventor: Luigi Pascucci, Sesto San Giovanni, Italy

[73] Assignee: SGS-Thomson Microelectronics S.r.l., Agrate Brianza, Italy

[21] Appl. No.: 841,903

[22] Filed: Apr. 17, 1997

[30] Foreign Application Priority Data

Apr. 18, 1996 [EP] European Pat. Off. .............. 96830215

[51] Int. Cl.⁶ .................................................. G11C 13/00
[52] U.S. Cl. ..................................... 365/200; 365/189.01
[58] Field of Search ................................... 365/200, 222, 365/189.01

[56] References Cited

U.S. PATENT DOCUMENTS

| 5,659,509 | 8/1997 | Golla et al. .............................. 365/200 |
| 5,687,125 | 11/1997 | Kikucni ................................... 365/200 |

FOREIGN PATENT DOCUMENTS

| 0 657 814 | 6/1995 | European Pat. Off. ......... G06F 11/20 |
| 0 668 562 | 8/1995 | European Pat. Off. ......... G06F 11/20 |
| 0 668 563 | 8/1995 | European Pat. Off. ......... G06F 11/20 |

OTHER PUBLICATIONS

European Search Report from European Patent Application 96830215.8, filed Apr. 18, 1996.

*Primary Examiner*—Terrence W. Fears
*Attorney, Agent, or Firm*—Wolf, Greenfield & Sacks, P.C.

[57] ABSTRACT

A redundancy memory register for storing defective addresses of defective memory elements in a memory device includes a plurality of memory units each one storing a respective defective address bit and comparing the defective address bit stored therein with a respective current address bit of a current address supplied to the memory device. The register includes a first group of memory units and a second group of memory units storing a first defective address, and a third group of memory units storing, together with the first group, a second defective address which has an address part in common with the first defective address. The first and second group of memory units supply first redundancy selection means for selecting a first redundancy memory element when the current address coincides with the first defective address. The first and third group of memory units supply second redundancy selection means for selecting a second redundancy memory element when the current address coincides with the second defective address. The register comprises first address configuration detection means for detecting if the current address coincides with a default configuration stored in the first and second group of memory units and for correspondingly deactivating the first and second redundancy selection means, and second address configuration detection means for detecting if the current address coincides with a default configuration stored in the third group of memory units and for consequently deactivating the second redundancy selection means.

20 Claims, 5 Drawing Sheets

REDUNDANCY MEMORY REGISTER

BACKGROUND OF THE INVENTION

1. Field of the Invention

The present invention relates to a redundancy memory register of the type used in semiconductor memory devices to implement redundancy.

2. Discussion of the Related Art

In semiconductor memory devices redundancy memory elements are conventionally provided for functionally replacing defective memory elements. Since semiconductor memory devices generally comprise a matrix of memory cells arranged in rows (word lines) and columns (bit lines), redundancy word lines and/or redundancy bit lines are provided in the memory devices for functionally replacing defective word lines and/or defective bit lines, respectively. When a defective memory element is replaced by a redundancy one, the defective memory element is said to have been "redunded" or "repaired".

A redundancy circuit must be provided for storing the addresses of the defective memory elements (defective addresses), comparing the stored defective addresses with a current address supplied to the memory device, preventing the activation of the addressed defective memory element and activating in substitution a redundancy memory element. To this purpose, the redundancy circuit comprises non-volatile redundancy memory registers wherein the defective addresses are permanently stored.

Obviously, the higher the number of redundancy memory elements provided in the memory device, the higher the number of defects that can be repaired. However, the number of redundancy memory elements must be small, because the redundancy circuit occupies a significant area in the memory device chip.

Therefore, it would be desirable to reduce the area occupied by the redundancy circuit, so to increase the number of redundancy memory element which can be integrated in a memory device.

In view of the state of the art described, it is an object of the present invention to provide a redundancy register having a structure suitable for reducing the area occupied in a memory device chip by the redundancy circuit.

SUMMARY OF THE INVENTION

According to the present invention, this and other objects are attained thanks to a redundancy memory register for storing defective addresses of defective memory elements in a memory device, comprising a plurality of memory units each one storing a respective defective address bit and comparing the defective address bit stored therein with a respective current address bit of a current address supplied to the memory device, wherein said plurality of memory units comprises a first group of memory units, a second group of memory units and a third group of memory units, the first and second groups of memory units storing a first defective address, the first and third group of memory units storing a second defective address, the second defective address and the first defective address having a common address part which is stored in the first group of memory units, the first and second group of memory units supplying first redundancy selection means for selecting a first redundancy memory element when the current address coincides with the first defective address, the first and third group of memory units supplying second redundancy selection means for selecting a second redundancy memory element when the current address coincides with the second defective address, and in that it comprises first address configuration detection means for detecting if the current address coincides with a default configuration stored in the first and second group of memory units and for correspondingly deactivating the first and second redundancy selection means, and second address configuration detection means for detecting if the current address coincides with a default configuration stored in the third group of memory units and for consequently deactivating said second redundancy selection means.

Thanks to the present invention, a redundancy memory register is provided suitable to store two defective addresses having a common address part but requiring less memory units than those which would be necessary if two distinct redundancy registers were used. The redundancy register according to the present invention has a first group of memory units wherein the common part of the two defective addresses is stored, and two other groups of memory units wherein it is possible to store the remaining parts of the two defective addresses. Thanks to the provision of the address configuration detection means, it is possible to leave the redundancy register completely unprogrammed: this will not cause an undesired selection of the redundancy memory elements associated with the redundancy register even if the memory device is supplied with an address corresponding to a default configuration stored in the unprogrammed memory units. Also, it is possible to program only one defective address, leaving the redundancy register available for a successive programming of a second defective address: in this case, the first defective address is programmed in the first group and in the second groups of memory units, while the third group of memory units is left unprogrammed; again, this does not cause undesired selection of the redundancy memory element associated with the third group of memory units when the current address has a part corresponding to the unprogrammed state of the memory units of the third group, because the address configuration detection means prevent in this case selection of the redundancy memory element associated with the third group of memory units.

BRIEF DESCRIPTION OF THE DRAWINGS

These and other features and advantages of the present invention will be made more evident by the following detailed description of two particular embodiments, described as non-limiting examples in the annexed drawings, wherein.

DETAILED DESCRIPTION

Figure 1:
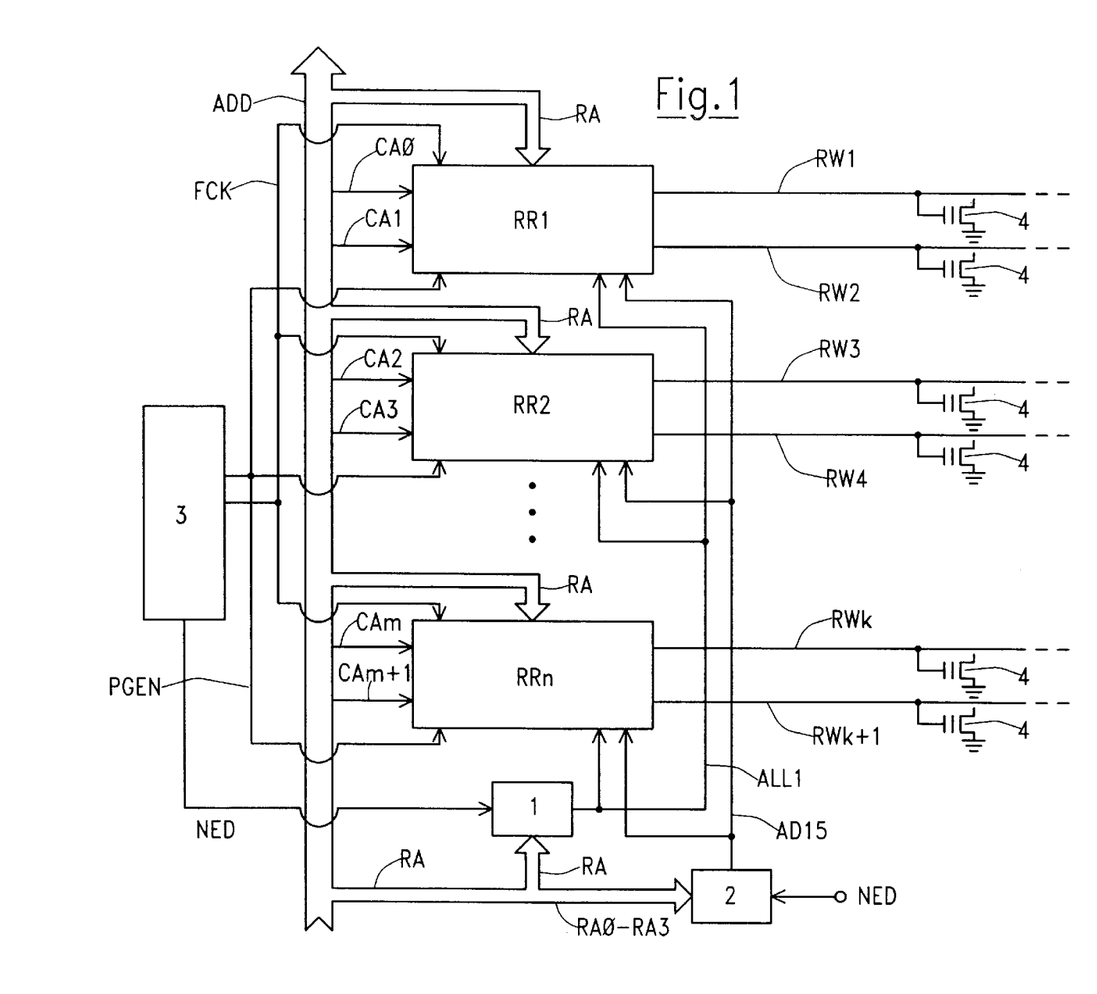
FIG. 1 is a schematic block diagram of a redundancy circuit comprising redundancy memory registers according to a first embodiment of the present invention.

With reference to FIG. 1, a redundancy circuit comprising a plurality of redundancy memory registers RR1-RRn according to a first embodiment of the present invention is schematically shown. The redundancy circuit is for example, a row redundancy circuit intended to be integrated in a semiconductor memory device to allow the functional substitution of redundancy word lines for defective word lines of a matrix of memory elements. However, the redundancy circuit shown in FIG. 1 could as well be a column redundancy circuit integrated in the memory device for functionally substituting redundancy bit lines for defective bit lines.

Each redundancy register RR1-RRn is supplied by a bus RA of row address signals; bus RA comprises a sub-set of address signals of an address signal bus ADD comprising in a per-se known way row address signals and column address signals.

The redundancy circuit also comprises two address configuration detector circuits 1 and 2. Address configuration detector 1 is supplied by all the row address signals of bus RA, and controls the activation of a control signal ALL1 which is supplied to all the redundancy registers RR1-RRn. Address configuration detector 2 is supplied by a sub-set RA0–RA3 of the row address signals and controls the activation of another control signal AD15 also supplied to all the redundancy registers RR1-RRn.

Each redundancy register RR1-RRn is further supplied by two respective column address signals (CA0,CA1), (CA2, CA3), . . . (CAm,CAm+1); as will be explained in the following, column address signals are supplied to the redundancy registers for programming selection purposes.

Also shown in FIG. 1 is a control logic 3 conventionally provided in each memory device to control the operation mode of the memory device. The control logic 3 controls the activation of a program enable signal PGEN which is supplied to all the redundancy registers. The control logic 3 also controls the activation of a first test signal FCK, activated in a particular test mode, which is also supplied to all the redundancy registers. In said test mode, control logic 3 also activates another test signal NED, which is supplied to the address configuration detectors 1 and 2.

Each redundancy register RR1-RRn is associated with two respective redundancy word lines (RW1,RW2), (RW3, RW4), (RWk,RWk+1) of redundancy memory cells 4. Each redundancy register controls the selection of the two associated redundancy word lines.

Figure 2:
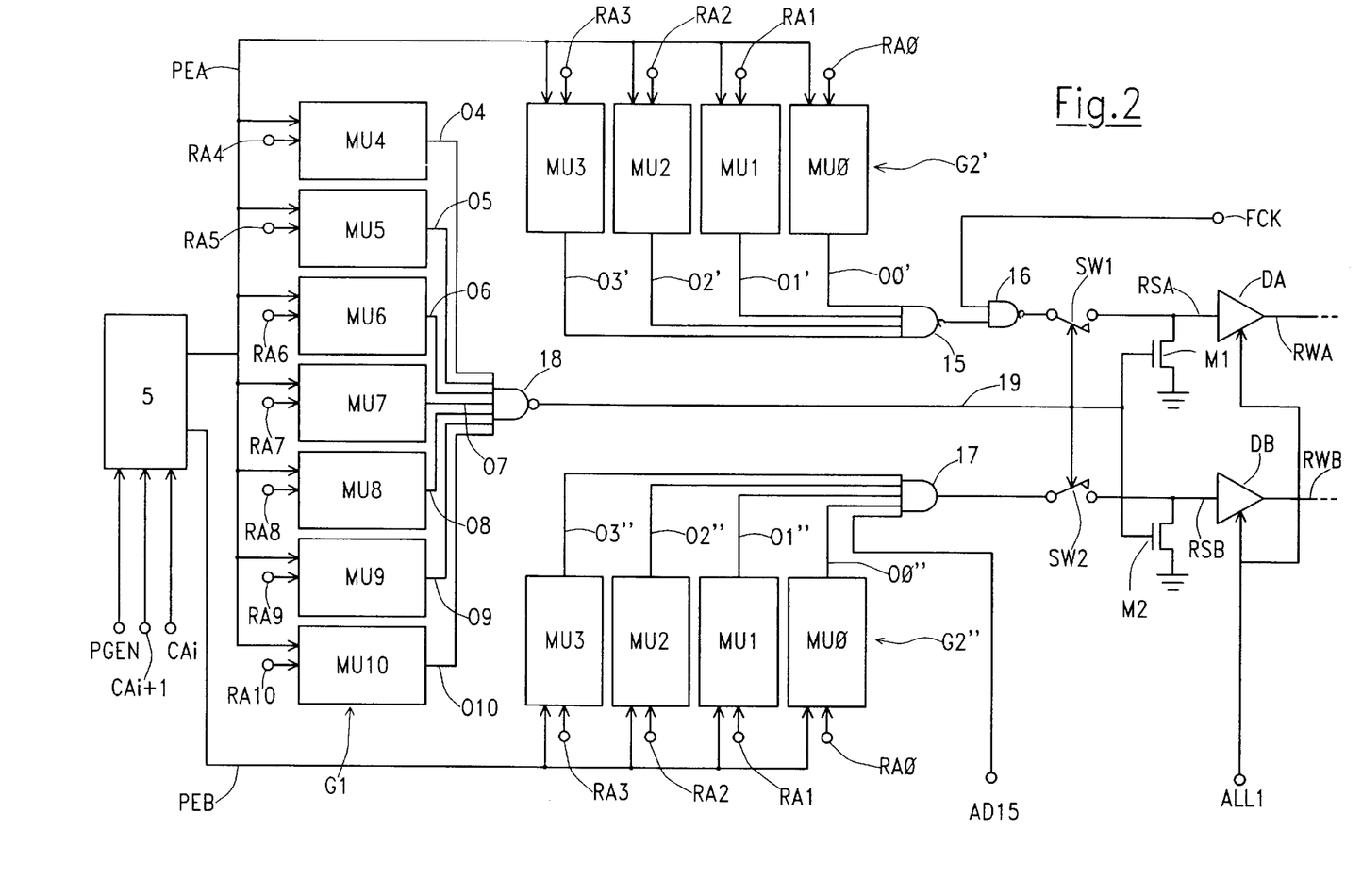
FIG. 2 is a schematic block diagram of a redundancy register according to the first embodiment of the present invention.

FIG. 2 is a schematic diagram of one of the redundancy registers RR1-RRn. The redundancy register comprises three groups G1, G2' and G2" of memory units; each memory unit is capable of storing a digital information unit. A first group G1 comprises seven memory units MU4–MU10, a second group G2' comprises four memory units MU0–MU3 and a third group G2" comprises four memory units MU0–MU3. Each one of the memory units MU4–MU10 in the first group G1 is supplied by a respective row address signal RA4–RA10; each one of the memory units MU0–MU3 in the second group G2' is supplied by a respective row address signal RA0–RA3; each one of the memory units MU0–MU3 in the third group G2" is supplied by a respective one of the row address signals RA0–RA3. In this example, signals RA0–RA3 represent the four least significant bits of the row address code, and signals RA4–RA10 represent the seven most significant bits of the row address code.

As will be explained in detail in the following, each memory unit comprises a programmable non-volatile memory element (such as, for example, a fuse or an EPROM memory cell) storing a respective bit of a defective address, and a circuit suitable for comparing the defective address bit stored therein with the respective bit of the current row address code supplied to the memory device. Each memory unit has a respective output signal O0'–O3', O0"–O3" and O4–O10 which is activated when the respective bit of the current row address code supplied to the memory device coincides with the defective address bit stored in the respective memory element. The output signals O0'–O3' of the second group G2' of memory units are supplied to a first NAND gate 15 whose output supplies a first input of a second NAND gate 16; the second input of NAND gate 16 is supplied by the test signal FCK generated by the control logic 3, and the output of NAND gate 16 supplies a first switch SW1. The output signals O0"–O3" of the third group G2" of memory units supply an AND gate 17 which is also supplied by the signal AD15 generated by the address configuration detector circuit 2 in FIG. 1; the output of AND gate 17 supplies a second switch SW2. The output signals O4–O10 of the first group G1 of memory units supply a NAND gate 18 whose output signal 19 controls switches SW1 and SW2 to close when activated (low logic level). Signal 19 also controls the activation of two pull-down N-channel MOSFETs M1, M2 connected between a respective one of two redundancy selection signals RSA, RSB and ground: when signal 19 is deactivated (high logic level), switches SW1 and SW2 are open and MOSFETs M1 and M2 are closed to pull signals RSA and RSB to ground, preventing them from remaining floating. Logic gates 15, 16, 17 and 18 can obviously be substituted by other combinations of logic gates, provided the latter implement the same logic function.

Signals RSA and RSB supply two respective drivers DA, DB whose outputs drive two respective redundancy word lines RWA, RWB. Drivers DA and DB are controlled by signal ALL1 generated by the address configuration detector 1 of FIG. 1.

The redundancy register also comprises a programming control circuit 5 supplied by the program enable signal PGEN, generated by the control logic 3, and by two respective column address signals CAi, CAi+1. Programming control circuit 5 generates two programming signals PEA, PEB: signal PEA is supplied to the memory units of the first and second groups G1 and G2', signal PEB is supplied to the memory units of the third group G2". Signals PEA and PEB, when activated, enable programming of the memory units to which they are supplied. The column address signals CAi, when activated, enables programming of that particular redundancy register among all those available. Column address signal CAi+1 allows to select which one of the two programming signals PEA, PEB is to be activated.

Figure 3:
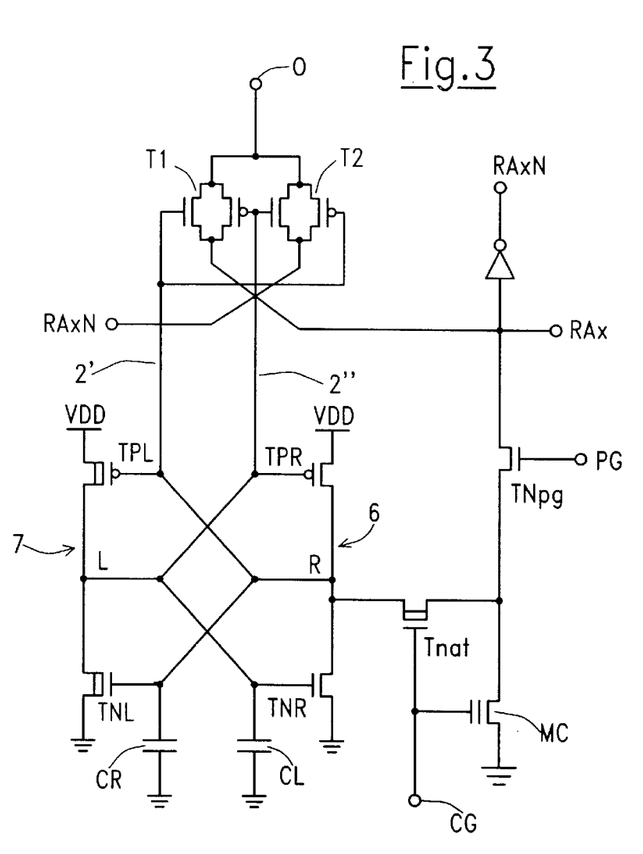
FIG. 3 is a circuit diagram of a memory unit of the redundancy register of FIG. 2.

FIG. 3 is a circuit diagram of one of the memory units MU0–MU10. The circuit comprises a programmable memory element MC, for example a floating-gate MOS transistor of the type used to form EPROM memory cells, with source connected to ground, drain coupled to the respective row address signal RAx through a decoupling transistor TNpg, and control gate controlled by a control signal CG.

The circuit also comprises a bistable latch having a right branch 6 and a left branch 7. The right branch 6 comprises a P-channel MOSFET TPR and an N-channel MOSFET TNR connected in series between a voltage supply VDD (typically 5 V or less) and ground. The left branch 7 comprises a P-channel MOSFET TPL and an N-channel MOSFET TNL connected in series between VDD and ground. A common node R of MOSFETs TPR and TNR is connected to gate electrodes of MOSFETs TPL and TNL; a common node L of MOSFETs TPL and TNL is connected to gate electrodes of MOSFETs TPR and TNR. Node R is also connected, through an N-channel MOSFET Tnat controlled by the control signal CG, to the drain of MC. Two capacitors CR and CL are preferably provided between node R and ground, and between node L and ground, respectively, to facilitate the proper setting of the latch at the circuit power-up.

The two branches 6, 7 of the bistable latch are not perfectly symmetric: MOSFET TPR is fabricated to have a threshold voltage lower (in absolute value) than the threshold voltage of MOSFET TPL; for example, TPR has a threshold voltage of approximately −0.9 V while TPL has a threshold voltage of approximately −1.6 V. Also, MOSFET TNR is fabricated to have a threshold voltage higher than the threshold voltage of MOSFET TNL; for example, TNR has a threshold voltage of approximately 0.8 V while TNL has a threshold voltage of approximately 0.4 V. The bistable latch is therefore unbalanced.

Nodes R and L directly control two transfer gates T1 and T2; activation of T1 and T2 is mutually exclusive: when T1 is activated, the output signal O is connected to the address signal RAx, when T2 is activated O=RAxN (the logic complement of RAx).

Conventionally, row address signal RAx (and the complement RAxN) can take digital voltage levels of 0 V and 5 V or 3 V.

Signal PG is one of the two programming signals PEA, PEB, and is normally kept at zero volt, but it is raised to approximately 12 V when the memory element MC must be programmed. Signal CG is normally kept at 5 V (or lower), but it is raised to approximately 12 V when MC must be programmed.

To program the memory element MC, signal PG is raised to approximately 12 V, and signal CG is switched to 12 V; if the datum carried by line RAx is a logic "0", MC remains unprogrammed. If the datum carried by line RAx is a logic "1", the threshold voltage of MC increases.

At the circuit power-up, when VDD raises from zero volt to the prescribed value of 5 V or 3 V, node L sets low and node R sets high; this is made possible by the very fact that latch 5 is unbalanced: CR and CL initially keep nodes R and L at the ground voltage, but since MOSFET TPL has a lower threshold voltage than MOSFET TPR the current flowing in the left branch is higher than the current flowing in the right branch; the potential of node R is a little higher than that of node L, MOSFET TNL begins to turn on pulling node L to ground and thus TNR turns off and TPR turns on, raising the potential of node R to VDD.

If the memory element MC is programmed (high threshold voltage), it will not drain current and node R remains high; transfer gate T1 will be open and T2 will be closed, so that O=RAx; O will be equal to "1" only if RAx="1". If instead MC is not programmed (virgin), it will drain current from MOSFET TPR; node R is pulled toward ground, TPL turns on and node L rises toward VDD; transfer gate T1 will be closed and T2 will be open, so that O=RAxN; O will be equal to "1" only if RAxN="1", that means RAx="0". O will be equal to "1" only if the datum carried by RAx coincides with the datum stored in the memory element MC.

MOSFET Tnat is useful during the initial setting of latch 5 at the power-up (when R goes high) to limit the voltage on the drain of MC.

Figure 4:
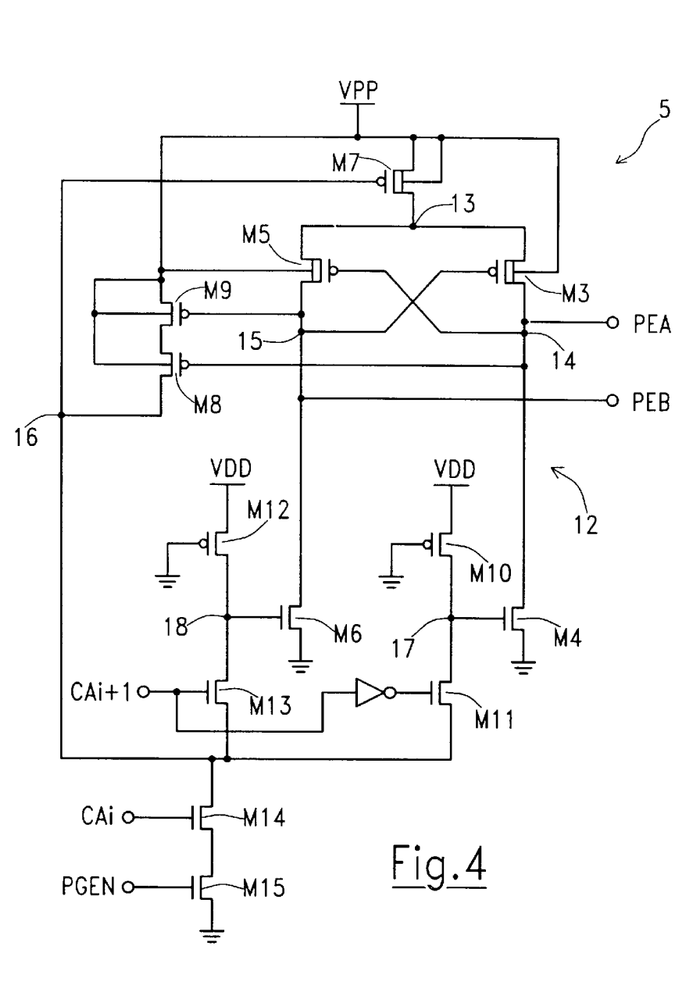
FIG. 4 is a circuit diagram of a programming circuit for the redundancy register of FIG. 2.

FIG. 4 is a diagram of the programming control circuit 5. The circuit comprises a cross-coupled structure having a first branch and a second branch. The first branch comprises a P-channel MOSFET M3 and an N-channel MOSFET M4 connected in series between a circuit node 13 common to the two branches and ground; the second branch comprises a P-channel MOSFET M5 and an N-channel MOSFET M6 connected in series between node 13 and ground. Node 13 is connected to a drain of a P-channel MOSFET M7 with source connected to a programming voltage supply VPP (conventionally 12 V). A gate of MOSFET M5 is connected to an intermediate node 14 in the first branch representing the programming signal PEA; a gate of MOSFET M3 is connected to an intermediate node 15 in the second branch forming the programming signal PEB. Node 14 and node 15 are also connected to gates of respective P-channel MOSFETs M8 and M9 connected in series between the programming voltage supply VPP and a circuit node 16 which is in turn connected to a gate of MOSFET M7. A gate of MOSFET M4 is connected to an output node 17 of a first inverter comprising a P-channel MOSFET M10 and an N-channel MOSFET M11; a source of MOSFET M11 is connected to node 16. Similarly, a gate of MOSFET M6 is connected to an output node 18 of a second inverter comprising a P-channel MOSFET M12 and an N-channel MOSFET M13; a source of MOSFET M13 is connected to node 16. MOSFETs M10 and M12 have gates connected to ground; MOSFETs M13 and M11 are respectively controlled by a column address signal CAi+1 and by the logic complement thereof. Node 16 is coupled to ground through a series connection of two N-channel MOSFETs M14 and M15, the first controlled by a column address signal CAi and the second controlled by the program enable signal PGEN.

As long as PGEN is deactivated (low logic level), nodes 17 and 18 are pulled to VDD, M4 and M6 are on, signals PEA and PEB are at the low logic level, M8 and M9 are on, node 16 is pulled to VPP and M7 is off. The circuit assures that signals PEA and PEB are not erroneously activated even in case of spikes on VDD, because any undesired increase in VDD turns M4 and M6 more strongly on and signals PEA and PEB are more strongly tied to ground.

When the redundancy register is to be programmed, PGEN and CAi are switched to the high logic level, thus providing ground to inverters (M10,M11) and (M12,M13). Node 16 is also pulled to ground and M7 is turned on, thus connecting node 13 to VPP; according to the logic level of signal CAi+1, either node 18 or node 17 will be pulled to ground, turning the respective MOSFET M6 or M4 off: either signal PEB will be pulled high and signal PEA will be tied to ground, or vice-versa.

Figure 5:
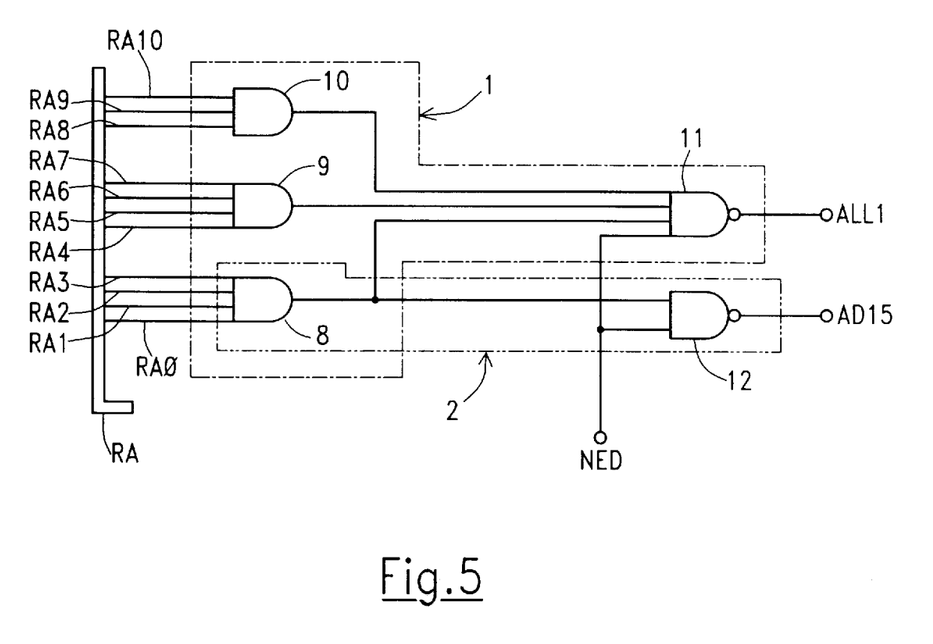
FIG. 5 is a diagram of an address configuration detector circuit of the redundancy circuit of FIG. 1.

FIG. 5 is a diagram of the address configuration detector circuits 1 and 2: signal ALL1 forms the output of a decoding circuit comprising three AND gates 8, 9 and 10 supplied with the row address signals RA0–RA3, RA4–RA7 and RA8–RA10, respectively, and a NAND gate 11 supplied with the outputs of AND gates 8, 9 and 10 and with the test signal NED generated by the control logic 3. Signal AD15 forms the output of another decoding circuit comprising the AND gate 8 and a NAND gate 12 supplied with the output of AND gate 8 and with the test signal NED. Signal ALL1 is activated (low logic level) when RA0=. . . =RA10="1"; signal AD15 is activated (low logic level) when RA0=. . . =RA3="1". Activation of signal AD15 prevents the activation of the redundancy word line selection signals RSB (FIG. 2). Activation of signal ALL1 deactivates all the redundancy word line drivers DA, DB (FIG. 2). Activation of test signal NED prevents the activation of signals ALL1 and AD15 independently of the configuration of row address signals RA0–RA10.

The operation of the redundancy circuit previously described will be now explained.

During the in-factory testing of the memory device, all the memory cells of the memory matrix are verified to detect the presence of defective memory cells. The testing apparatus keeps memory of the addresses of the defective word lines.

Then, the defective addresses corresponding to defective word lines must be stored in the redundancy registers. The testing apparatus detects if, among all the defective addresses, there are pairs of defective addresses sharing the same configuration of the seven most significant bits. Each of these pairs of defective addresses can be stored in a single redundancy register, instead of in different redundancy registers, thus optimizing the use of redundancy resources.

To program a pair of defective addresses sharing the same configuration of the seven most significant bits RA4–RA10 in a given redundancy register, the testing apparatus drives the memory device so that the control logic 3 activates the signal PGEN. By means of the column address signals CA0, CA2, . . . CAm it is possible to select which one of the plurality of redundancy registers RR1-RRn is to be programmed; by means of the column address signals CA1, CA3, . . . CAm+1 it is possible to select, inside the selected redundancy register, the groups (G1,G2') or G2" of memory units wherein the first and the second defective address of said pair is to be programmed. Normally, when a redundancy register is programmed for the first time, the first defective address of said pair is programmed into groups (G1,G2') of memory units, activating signal PEA, and the least significant bits of the second defective address of the pair are programmed in group G2" by activating signal PEB.

If none of the two defective addresses of said pair has RA0=. . . =RA3="1", either one or the other of the two defective addresses can be stored in groups (G1,G2') of memory units, the choice being unessential.

If differently one of the two defective addresses of said pair has RA0=. . . =RA3="1", such defective address must be programmed in groups (G1,G2') of memory units, and not in groups (G1,G2"), because as previously described the activation of redundancy selection signals RSB (associated to addresses stored in groups G1,G2") is inhibited when the current address has RA0=RA3="1". In this case, the testing apparatus programs the defective address with RA0=RA3="1" first, then it programs the other defective address of the pair.

The defective addresses which do not share the seven most significant bits with other defective addresses must be programmed alone in respective redundancy registers. As already mentioned, when a given redundancy register is programmed for the first time, the defective address is written in groups G1 and G2' of memory units of said redundancy register. The memory units of group G2" are left unprogrammed, in a default state which, in the present example, corresponds to four logic "1"s. These means that when the memory device is operated in read mode and the current address has RA0=RA3="1" the output signals O0"–O3" of the memory units MU0–MU3 of group G2" will be activated, because they recognize the current address signal as coincident with the configuration stored therein.

However, thanks to the control operated by address configuration detector 2 and to the inhibition of the activation of the redundancy selection signals RSB when the least significant bits of the current address are RA0=RA3="1", it is possible to prevent that one or more redundancy word lines are incorrectly selected.

It is thus possible to leave one of the two redundancy word lines associated to a given redundancy register available for subsequently storing another defective address of another defective word line which is for example detected in a subsequent step of the memory device testing.

Also, redundancy registers not programmed at all (in which all the memory units of groups G1, G2' and G2" are in the default unprogrammed state) do not cause selection of the associated redundancy word lines when the current address supplied to the memory device is RA0=. . . =RA10= "1", because this address causes signal ALL1 to be activated and the redundancy word line drivers DA, DB to be deactivated. Obviously, this means that a defective word line having the address RA0=. . . =RA10="1" cannot be repaired.

The structure of the redundancy register according to the present invention also allows a fast test methodolgy for detecting which addresses are defective and have been redunded (or, conversely, how many redundancy memory elements are left available). This technique provides for activating test signal FCK to force the output of NAND gate 16 in each redundancy register to a predetermined logic level equal to the logic level it would assume if the configuration of address signals RA0–RA3 were equal to the address configuration stored in the memory units MU0–MU3 of the second group G2'. Then, only the most significant address signal A4–A10 are scanned, so that when the configuration of signals A4–A10 coincides with the one stored in the first group G1 of memory units MU4–MU10 of one of the redundancy registers RR1-RRn, the respective redundancy selection signal RSA is activated and the corresponding redundancy word line RWA selected; this event can be detected externally of the memory device if for example in this test mode the redundancy word lines drivers DA, DB are made to directly drive output terminals of the memory device. When such an event is detected, the current configuration of address signals RA4–RA10 is maintained, signal FCK is deactivated and the remaining address signals RA0–RA3 are scanned: when the configuration of signals RA0–RA3 corresponds to the defective address part stored in the second group G2' or the third group G2" of memory units of the redundancy register, a transition will be detected at the output terminal of the memory device, indicating that the current address corresponds to a defective memory element. In this test mode address configuration detectors 1 and 2 should be deactivated so that signals RSA and RSB can be activated also in the case RA0=. . . =RA10="1" or RA0=. . . =RA3="1" (i.e., the default configuration stored in unprogrammed redundancy registers): in this way it is possible to detect how many redundancy word lines are still available.

Figure 6:
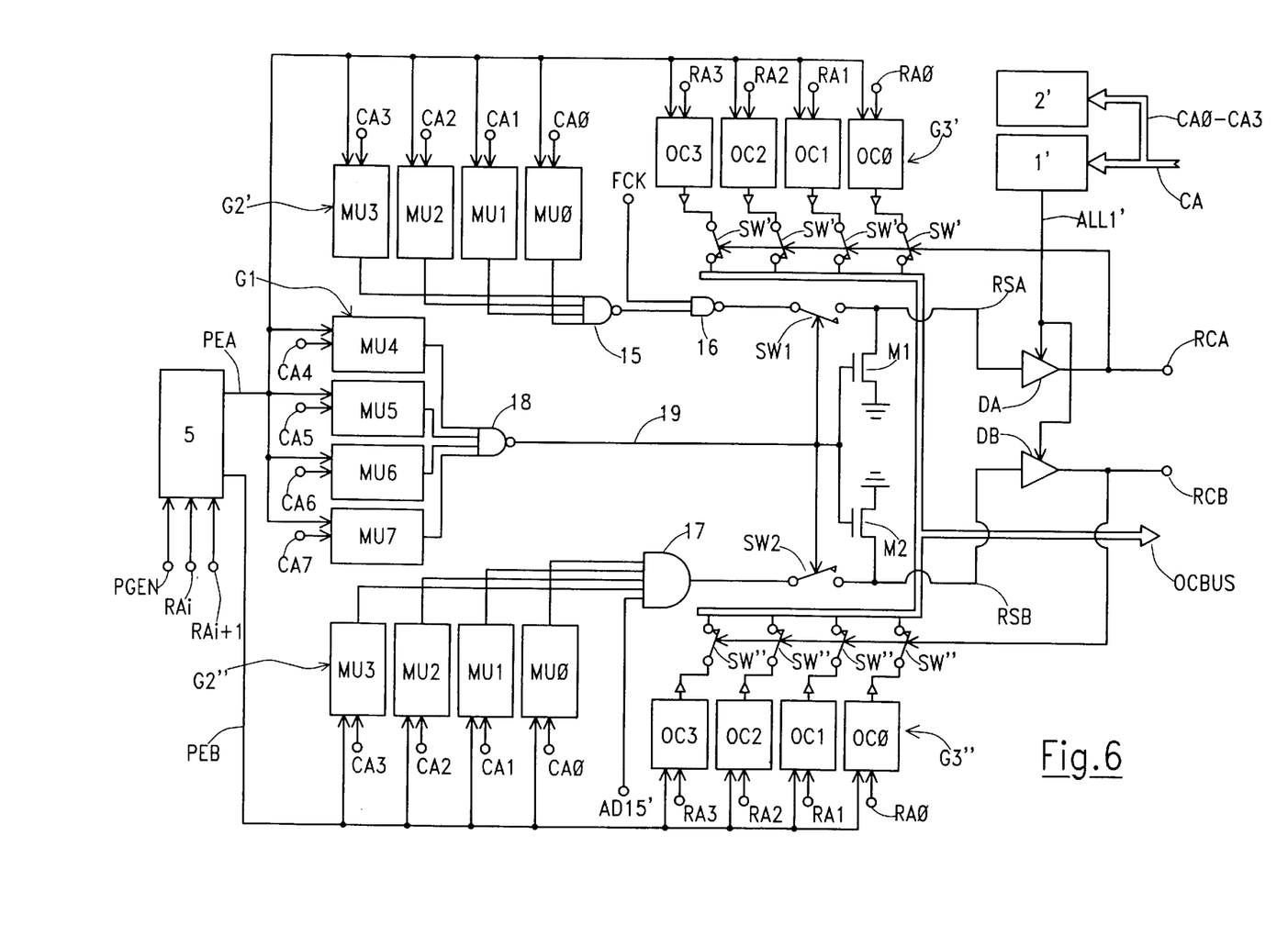
FIG. 6 is a schematic block diagram of a redundancy memory register according to a second embodiment of the present invention.

It should be observed that after having detected that the current configuration of address signals A4–A10 corresponds to the most significant part of a defective address, it is immediately possible to determine if the redundancy register wherein said part of defective address is stored is completely utilized or if only one defective address is stored therein: to this purpose, since as already told it is assumed that defective addresses having RA0=. . . =RA3="1" are never stored in the third group G2" of memory units, it is sufficient to deactivate signal FCK and to supply the memory device with a configuration of address signals RA0–RA3 corresponding to the default state of the memory units: if a level transition is detected at the output terminal of the memory device, then it means that only one defective address is stored in the redundancy register, and there is the possibility to redund another defective address having a configuration of signals RA4–RA10 identical to that of the already stored defective address. FIG. 6 is a schematic block diagram of a redundancy memory register according to a second embodiment of the present invention.

While the redundancy memory register previously described can be used as well in a row redundancy circuit as in a column redundancy circuit, the redundancy register according to this second embodiment is particularly suitable for a column redundancy circuit.

More specifically, the redundancy register according to this second embodiment can be used in a memory device wherein a unique group of redundancy bit lines is provided for all the packets of bit lines forming the portions of the memory matrix associated to respective output bits of the output word of the memory device, and the column redundancy circuit allows to substitute a defective bit line in one of said packets without causing all the bit lines in other packets having the same address as the defective bit line to be automatically substituted too. A column redundancy circuit of this kind is for example described in EP-A-661636 and EP-A-668562 (both in the name of the same Applicant), which are incorporated herein by reference.

Referring to FIG. 6, the redundancy register comprises a first group G1 of memory units MU4–MU7 associated to respective column address signals CA4–CA7 representing for example the four most significant bits of a column address code; a second group G2' of memory units MU0–MU3 associated to respective column address signals CA0–CA3 representing the four least significant bits of the column address code; and a third group G2" of memory units MU0–MU3 also associated to column address signals CA0–CA3. Memory units MU0–MU7 have the structure shown in FIG. 3.

Associated with group G2' is a group G3' of memory units OC0–OC3 having a structure similar to that of MU0–MU7, but they do not comprise the digital comparator formed by transfer gates T1 and T2 in FIG. 3 (because memory units OC0–OC3 shall only store a binary information unit, but they must not perform any comparison of the datum stored therein with an external datum).

Associated with group G2" is another group G3" of memory units OC0–OC3 identical to those in group G3'.

Memory units MU0–MU7 of groups G1 and G2' store a first defective bit line address and compare the first defective address stored therein with a current column address supplied to the memory device and carried by address signals CA0–CA7. Memory units MU0–MU7 of groups G1 and G2" store a second defective bit line address having the most significant bits in common with the first defective address, and compare the second defective address stored therein with the current address. If the current address coincides with either the first defective address or the second defective address, either redundancy column selection signal RCA or RCB will be activated.

Memory units OC0–OC3 in group G3' store a digital code representative of the packet of matrix bit lines to which the defective bit line whose address is stored in groups G1 and G2' of memory units belongs. Similarly, memory units OC0–OC3 in group G3" store a digital code representative of the packet of matrix bit lines to which the defective bit line whose address is stored in groups G1 and G2" of memory units belongs. In the shown example, it has been assumed that the memory device in which the column redundancy circuit is integrated has sixteen output data termninals, so that a four-bit code is necessary to discriminate one packet of bit lines among sixteen. In the case of a byte-organized memory device, only three memory units per group G3' and G3" are necessary.

When the current address supplied to the memory device coincides with the first defective address stored in the redundancy register, activation of redundancy bit line selection signal RCA causes four switches SW' to close, connecting respective outputs of the memory units OC0–OC3 of group G3' to respective signals of an output code bus OCBUS. When differently the current address coincides with the second defective address stored in the redundancy register, activation of redundancy bit line selection signal RCB causes another group of four switches SW" to close, connecting respective outputs of the memory units OC0–OC3 of group G3" to the signals of bus OCBUS. When the current address is not coincident with the first or second defective addresses, switches SW' and SW" are all open.

The signals of bus OCBUS can be used to identify the packet of bit lines to which the defective bit line belongs, preventing selection thereof or, for example, inhibiting the sensing circuits associated to said packet of bit lines.

Also shown in FIG. 6 are two address configuration detectors 1' and 2': these circuits are identical to circuits 1 and 2 described in connection with the previous embodiment, the only difference being that they are supplied with the column address signals instead of the row address signals. Signal ALL1' will be activated when CA0=. . . =CA7="1", and signal AD15' will be activated (low logic level) when CA0=. . . =CA3="1", these being the default configuration stored in unprogrammed redundancy registers or, respectively, in redundancy registers wherein the group G2" of memory units is unprogrammed.

Also the programming control circuit 5 is identical to that described in connection with the first embodiment, the only difference being that, for selecting the redundancy register to be programmed and the groups of memory units within the selected redundancy register, two row address signals RAi, RAi+1 are used.

The redundancy register according to this second embodiment has all the features of the first embodiment previously described, because it allows storing two defective addresses sharing the most significant bits, and has the same inhibition features for addresses corresponding to default (unprogrammed) states of the redundancy registers.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A redundancy memory register for storing defective addresses of defective memory elements in a memory device, comprising a plurality of memory units each one storing a respective defective address bit and comparing the defective address bit stored therein with a respective current address bit of a current address supplied to the memory device, wherein said plurality of memory units comprises a first group of memory units, a second group of memory units and a third group of memory units, the first and second groups of memory units storing a first defective address, the first and third group of memory units storing a second defective address, the second defective address and the first defective address having a common address part which is stored in the first group of memory units, the first and second group of memory units supplying first redundancy selection means for selecting a first redundancy memory element when the current address coincides with the first defective address, the first and third group of memory units supplying second redundancy selection means for selecting a second redundancy memory element when the current address coincides with the second defective address, and first address configuration detection means for detecting if the current address coincides with a default configuration stored in the first and second group of memory units and for correspondingly deactivating the first and second redundancy selection means, and second address configuration detection means for detecting if the current address coincides with a default configuration stored in the third group of memory units and for consequently deactivating said second redundancy selection means.

2. The redundancy memory register according to claim 1, wherein each memory unit comprises at least one programmable memory element for storing the defective address bit, a sensing circuit for reading the defective address bit stored in the memory element, and digital comparator means for comparing the defective address bit stored in the memory element with the respective current address bit, the digital comparator means having an output which is activated when the current address bit coincides with the defective address bit.

3. The redundancy memory register according to claim 2, wherein said sensing circuit comprises a bistable latch having a set input coupled to said programmable memory element and an output suitable to take either one of two logic levels according to a programming state of the programmable memory element, said output supplying directly the digital comparator means.

4. The redundancy memory register according to claim 3, wherein said output of the sensing circuit comprises a first output and a complemented output, the complemented output being the logic complement of the first output, wherein said digital comparator means comprises a first switching means controlled by said first output for connecting a first signal line carrying said respective current address bit to the output of the memory units, and a second switching means controlled by said complemented output for connecting a second signal line carrying a logic complement of said respective address bit to the output of the memory unit, the second switching means being open when the first switching means are closed and vice-versa.

5. The redundancy memory register according to claim 4, wherein said first switching means comprise a first transfer gate comprising a first N-channel MOSFET and a first P-channel MOSFET parallel-connected and respectively controlled by said first output and second output, and the second switching means comprise a second transfer gate comprising a second N-channel MOSFET and a second P-channel MOSFET parallel-connected and respectively controlled by said second output and first output.

6. The redundancy memory register according to claim 5, wherein said bistable latch comprises a first circuit branch and a second circuit branch, the first circuit branch comprising a third P-channel MOSFET and a third N-channel MOSFET connected in series between a voltage supply and a reference voltage, the second circuit branch comprising a fourth P-channel MOSFET and a fourth N-channel MOSFET connected in series between the voltage supply and the reference voltage, a common node of the third P-channel and N-channel MOSFETs forming the set input and the first output of the bistable latch and being connected to gate electrodes of the fourth P-channel and N-channel MOSFETs, a common node of the fourth P-channel and N-channel MOSFETs forming a reset input and the second output of the bistable latch and being connected to gate electrodes of the third P-channel and N-channel MOSFETs.

7. The redundancy memory register according to claim 6, wherein said first and second circuit branch are unbalanced, the fourth P-channel MOSFET having a threshold voltage lower than that of the third P-channel MOSFET and the fourth N-channel MOSFET having a threshold voltage lower than that of the third N-channel MOSFET.

8. The redundancy memory register according to claim 7, wherein said programmable memory element is a floating-gate MOS transistor having a source electrode connected to the reference voltage and a drain electrode coupled to the set input of the bistable latch through voltage-limiting means.

9. The redundancy memory register according to claim 8, further comprising a programming circuit for programming the programmable memory element, the programming circuit comprising switching means for selectively coupling a programming electrode of the memory element to said first signal line.

10. The redundancy memory register according to claim 1, wherein said first redundancy selection means comprise first coincidence detecting means for detecting if the current address coincides with the first defective address and first redundancy driver means supplied by the first coincidence detecting means for activating a first redundancy selection signal, wherein the second redundancy selection means comprise second coincidence detecting means for detecting if the current address coincides with the second defective address, and second redundancy driver means supplied by the second coincidence detecting means for activating a second redundancy selection signal.

11. The redundancy memory register according to claim 10, wherein said first coincidence detecting means comprise a first combinatorial logic means for detecting if the outputs of the memory units of the first group are activated, a second combinatorial logic means for detecting if the outputs of the memory units of the second group are activated, and third switching means controlled by the first combinatorial logic means for selectively coupling the second combinatorial logic means with the first redundancy driver means, wherein said second coincidence detecting means comprise the first combinatorial logic means, a third combinatorial logic means for detecting if the outputs of the memory units of the third group are activated, and fourth switching means controlled by the first combinatorial logic means for selectively coupling the third combinatorial logic means with the second redundancy driver means.

12. The redundancy memory register according to claim 11, wherein said first address configuration detector means deactivate the first and second redundancy driver means when the current address concides with the default configuration stored in the memory units of the first and second groups.

13. The redundancy memory register according to claim 12, wherein said second address configuration detector means control the third combinatorial logic means to prevent activation of the second redundancy driver means when the current address coincides with the default configuration stored in the memory units of the third group.

14. The redundancy memory register according to claim 13, wherein said first address configuration detector means comprise a first decoder circuit supplied by the current address and having an output signal which is activated when the current address coincides with said default configuration stored in the first and second groups of memory units.

15. The redundancy memory register according to claim 14, wherein said second address configuration detector means comprise a second decoder circuit supplied by a subset of the current address signals and having an output which is activated when the configuration of said sub-set of address signals concides with said default address stored in the third group of memory units.

16. The redundancy memory register according to claim 15, further comprising programming control means for selectively activating programming one of the first and second groups of memory units together and the first and third groups of memory units together.

17. The redundancy memory register according to claim 1, further comprising a fourth group of memory units associated with the second group of memory units, and a fifth group of memory units associated with the third group of memory units, the fourth and fifth groups of memory units respectively storing digital codes of respective portions of a matrix of memory elements of the memory device, to which portion the defective memory element having the first defective address and the second defective address belongs.

18. The redundancy memory register according to claim 17, wherein the memory units of the fourth and fifth groups comprise at least one programmable memory element and a sensing circuit for reading a datum stored in the respective memory element.

19. The redundancy memory register according to claim 18, further comprising fifth switching means and sixth switching means respectively controlled by said first and second redundancy selection means to selectively connect outputs of one of the memory units of the fourth group and of the fifth group, respectively, to a matrix portion code bus.

20. A redundancy circuit for a memory device comprising a plurality of redundancy memory registers for storing defective addresses of defective memory elements, each memory register comprising a plurality of memory units each one storing a respective defective address bit and comparing the defective address bit stored therein with a respective current address bit of a current address supplied to the memory device, said plurality of memory units comprising a first group of memory units, a second group of memory units and a third group of memory units, the first and second groups of memory units storing a first defective address, the first and third group of memory units storing a second defective address, the second defective address and the first defective address having a common address part which is stored in the first group of memory units, the first and second group of memory units supplying first redundancy selection means for selecting a first redundancy memory element when the current address coincides with the first defective address, the first and third group of memory units supplying second redundancy selection means for selecting a second redundancy memory element when the current address coincides with the second defective address, the redundancy circuit comprising first address configuration detection means for detecting if the current address coincides with a default configuration stored in the first and second group of memory units of the redundancy memory registers and for correspondingly deactivating the first and second redundancy selection means in each redundancy memory register, and second address configuration detection means for detecting if the current address coincides with a default configuration stored in the third group of memory units of the redundancy memory registers and for consequently deactivating said second redundancy selection means in each redundancy memory register.

* * * * *